United States Patent
Hentz et al.

(10) Patent No.: US 9,331,606 B2
(45) Date of Patent: May 3, 2016

(54) DEVICE WITH SUSPENDED BEAM AND PIEZORESISTIVE MEANS OF DETECTING DISPLACEMENT OF THE BEAM AND METHOD OF MANUFACTURING THE DEVICE

(75) Inventors: Sebastien Hentz, Varces (FR); Philippe Andreucci, Moirans (FR); Eric Colinet, Grenoble (FR); Laurent Duraffourg, Voiron (FR); Sebastien Labarthe, Voiron (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 668 days.

(21) Appl. No.: 13/821,701

(22) PCT Filed: Sep. 9, 2011

(86) PCT No.: PCT/EP2011/065687
§ 371 (c)(1),
(2), (4) Date: Apr. 26, 2013

(87) PCT Pub. No.: WO2012/034951
PCT Pub. Date: Mar. 22, 2012

(65) Prior Publication Data
US 2013/0214644 A1  Aug. 22, 2013

(30) Foreign Application Priority Data

Sep. 13, 2010 (FR) ..................................... 10 57249

(51) Int. Cl.
*G01L 1/00* (2006.01)
*G01B 7/16* (2006.01)
(Continued)

(52) U.S. Cl.
CPC ................ *H02N 2/18* (2013.01); *B81B 3/0086* (2013.01); *H02N 2/22* (2013.01); *H03H 9/02259* (2013.01); *H03H 9/2405* (2013.01);
(Continued)

(58) Field of Classification Search
USPC ......................................... 310/311, 328, 338
See application file for complete search history.

(56) References Cited

U.S. PATENT DOCUMENTS 6,578,410 B1 *  6/2003  Israelachvili ................... 73/105
7,279,131 B2 * 10/2007  Wendelbo et al. ........... 422/68.1
(Continued)

FOREIGN PATENT DOCUMENTS

JP   2007-175577 A   7/2007
JP   2010-21210 A    1/2010
(Continued)

OTHER PUBLICATIONS

U.S. Appl. No. 13/824,719, filed Mar. 18, 2013, Duraffourg, et al.
(Continued)

*Primary Examiner* — Thomas Dougherty
(74) *Attorney, Agent, or Firm* — Oblon, McClelland, Maier & Neustadt, L.L.P.

(57) ABSTRACT

A device with a suspended beam and piezoresistive means of detecting displacement of the beam and a method of manufacturing the device are disclosed. The device comprises a support, a suspended beam, moving parallel to the plane of the support, and means of detecting displacement, comprising at least two piezoresistive strain gauges that are not in line with each other. The beam is suspended through detection means. The two gauges are located on two opposite lateral faces of the beam respectively.

10 Claims, 6 Drawing Sheets

(51) Int. Cl.
*H02N 2/18* (2006.01)
*H03H 9/02* (2006.01)
*H03H 9/24* (2006.01)
*B81B 3/00* (2006.01)
*H02N 2/00* (2006.01)

(52) U.S. Cl.
CPC ..... *B81B 2201/0271* (2013.01); *B81B 2203/0109* (2013.01); *H03H 2009/0244* (2013.01); *H03H 2009/02496* (2013.01); *Y10T 29/42* (2015.01)

(56) References Cited

U.S. PATENT DOCUMENTS

| | | | |
|---|---|---|---|
| 2007/0089536 A1* | 4/2007 | Morimoto | 73/862.045 |
| 2008/0314148 A1 | 12/2008 | Robert | |
| 2010/0277262 A1 | 11/2010 | Phan Le et al. | |
| 2011/0187347 A1 | 8/2011 | Goossens et al. | |
| 2013/0154440 A1* | 6/2013 | Hentz | 310/318 |

FOREIGN PATENT DOCUMENTS

| | | |
|---|---|---|
| WO | WO 2009/066203 A1 | 5/2009 |
| WO | WO 2010/015963 A1 | 2/2010 |

OTHER PUBLICATIONS

U.S. Appl. No. 13/818,771, filed Feb. 25, 2013, Hentz.
U.S. Appl. No. 13/820,756, filed Mar. 5, 2013, Hentz.
International Search Report Issued Sep. 29, 2011 in PCT/EP2011/065687.
French Preliminary Search Report Issued May 11, 2011 in Patent Application No. 1057249 (with English translation of Categories of Cited Documents).
E. Mile et al., "In-plane nanoelectromechanical resonators based on silicon nanowire piezoresistive detection", Nanotechnology, XP020174814, vol. 21, 2010, 7 pages.
U.S. Appl. No. 14/619,656, filed Feb. 11, 2015, Ruellan, et al.

* cited by examiner

DEVICE WITH SUSPENDED BEAM AND PIEZORESISTIVE MEANS OF DETECTING DISPLACEMENT OF THE BEAM AND METHOD OF MANUFACTURING THE DEVICE

TECHNICAL FIELD

This invention relates to a device comprising a suspended beam and piezoresistive means of detecting displacement of this beam and a method of manufacturing this device.

This device may be a resonant device, in which case the beam forms a resonator, or a non-resonant device.

Applications of the invention are particularly in the field of MEMS (Micro-Electro-Mechanical Systems) and NEMS (Nano-Electro-Mechanical Systems) type sensors.

For example, it is applicable to non-resonant sensors for the measurement of static or quasi-static forces, but is especially applicable to resonant sensors, for example mass sensors.

STATE OF PRIOR ART

The question of the choice of transduction at nanometric scales (particularly among capacitive, piezoelectric and piezoresistive transductions) has not been resolved.

This choice participates in the search to increase the transduction gain of a resonant device to be designed, namely the ratio between the amplitude of the electrical output signal from this device and the displacement amplitude of the resonator forming part of the device.

Piezoresistive gauges are usually used in MEMS applications and are placed on a structure to be detected, and are formed from locally doped silicon zones.

But in NEMS applications, with existing manufacturing methods, it is almost impossible to obtain locally doped silicon gauges small enough to be positioned on structures a few nanometers wide, without any residual stress.

And it is even less easy to make a Wheatstone bridge comprising such gauges, such as bridges conventionally used with the resonant sensors.

Nevertheless, excellent gains have been made with piezoresistive transduction, regardless of whether this transduction uses a metallic material in order to detect an out-of-plane movement, or semiconducting gauges etched for detection of in-plane movement, as explained in the following document that should be referred to:

[1] E. Mile et al., Nanotechnology, Vol. 21 Issue 16, pp. 165504 (2010).

A resonant device with piezoresistive detection is also known by the following document that should be referred to:

[2] US 2008/0314148, invention by P. Robert, corresponding to EP 2008965.

FIG. 1 shows a diagrammatic top view of an example of the device described in this document. It is formed on a substrate and comprises:

a resonator 2, in the form of a beam connected to the substrate through at least one embedment 4 (in fact, a second embedment 5 is provided in the example shown, as can be seen),
a fixed electrode 6 to actuate the resonator,
an alternating voltage source 8, to bring the electrode to an alternating voltage relative to the resonator, this resonator then vibrating parallel to the plane of the surface of the substrate, which is symbolised by the double arrow 9 in FIG. 1,
a suspended strain gauge 10 made of a piezoresistive material, and
means 12 of measuring the stress applied to the gauge 10.

This gauge 10 is connected to the resonator 2 at a point that is outside the embedment 4. The result is a lever arm that increases the strain applied on this gauge.

This type of solution is applicable to many NEMS in which the resonator is connected to the substrate through at least one embedment close to the strain gauge, or piezoresistive gauge, particularly when the resonator is a free embedded beam (the word "embedment" referring to a zone on the surface of the beam forming the resonator, which is directly connected to a fixed solid part and the displacement of which relative to the substrate is thus blocked).

Document [2] describes such a structure and actuation means and a diagram of the set up used to detect resonator movement.

As described above, the beam forming the resonator in the device described in document [1] comprises at least an embedded part that connects it to the substrate. This creates a problem.

A part of the stress amplified by the lever arm (resulting from the distance between the embedment and the point at which the strain gauge is connected to the beam) is lost in the embedment, although it is obviously required to maximise the stress applied to the piezoresistive gauge or the piezoresistive gauges when the device comprises more than one such gauge.

Furthermore, one of the sources of damping of the movement of the beam is the result of this loss of stress in the embedment; the quality factor of the resonant device referred to in document [1] is thus degraded.

PRESENTATION OF THE INVENTION

The purpose of this invention is to overcome the above-mentioned disadvantages.

This is achieved because the beam forming part of the device according to the invention is not directly connected to the substrate by an embedment: it is connected to it through piezoresistive detection means for detecting the movement of the beam.

Specifically, the purpose of this invention is a device with a suspended beam and piezoresistive means of detecting displacement of the beam, the device comprising:

a support comprising an approximately plane surface,
a beam suspended from the support and capable of moving parallel to the plane of the surface of the support, and
means of detecting displacement of the beam, comprising at least two approximately straight piezoresistive strain gauges suspended from the support, the two strain gauges not being in line with each other,
in which the beam is suspended from the support through the detection means and is thus not anchored to the support directly,
characterised in that said at least two strain gauges are respectively located on two opposite lateral faces of the beam.

The document WO 2010/015963 discloses an electromechanical transducer comprising a beam suspended from a support through two strain gauges; but these two gauges are placed on the same side of the beam.

The two gauges cannot be identical with such an arrangement; the piezoresistive signal would be cancelled out if they were identical. Furthermore, one of the two gauges must be much larger than the other (in which case it becomes very stiff and the advantage of an indirect suspension through detection means is lost), or the two gauges must be locally doped differently from each other. However, as mentioned above, it is difficult to achieve local doping at nanometric scales.

The device according to the invention overcomes these disadvantages: in this device, the two gauges are placed on opposite sides of the beam respectively; this means that identical uniform doping can be used for the two gauges and/or identical gauges can be used, therefore equally narrow, and that the detection signal can be maximised.

According to one particular embodiment of the invention, each strain gauge comprises a stack comprising at least one piezoresistive material.

According to one particular embodiment of the device according to the invention, the beam forms a resonator and the device also comprises means of actuating the beam.

These beam actuation means may for example be electrostatic.

The beam may have a constant cross-section or, on the contrary, a variable cross-section.

According to one particular embodiment of the invention, the two ends of the beam are free and are thus capable of moving parallel to the plane of the surface of the support, and the strain gauges are at a distance from these two ends.

According to one particular embodiment, the device comprises two groups each containing at least two strain gauges, and these two groups are located on two opposite lateral faces of the beam respectively.

In the invention, at least one of the strain gauges may be elastic.

The invention also relates to a method of manufacturing the device according to the invention, in which the beam and the strain gauges are formed using surface technology.

BRIEF DESCRIPTION OF THE DRAWINGS

This invention will be better understood after reading the description of example embodiments given below purely for information and that is in no way limitative, with reference to the appended drawings in which.

DETAILED PRESENTATION OF PARTICULAR EMBODIMENTS

Figure 1:
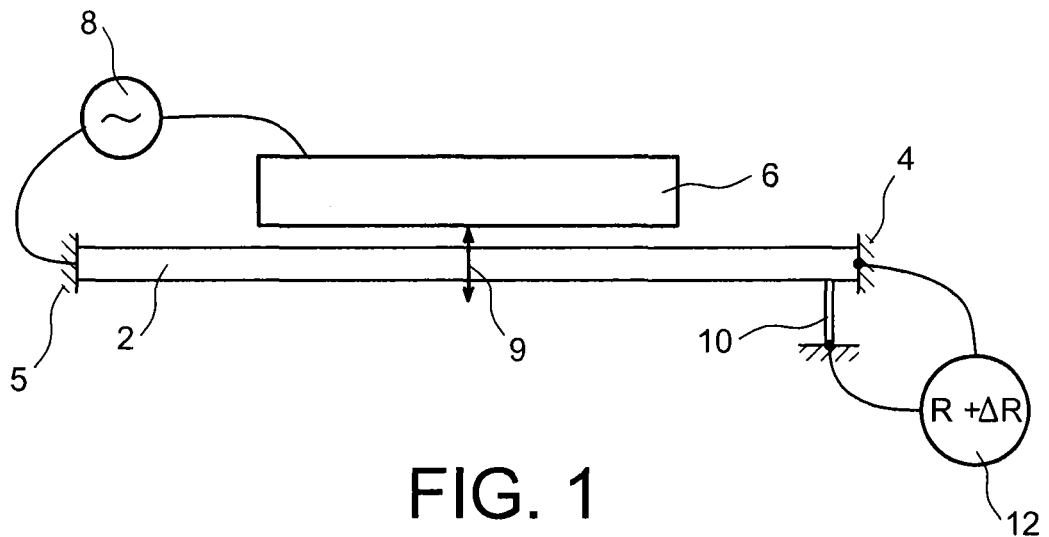
FIG. 1 is a diagrammatic top view of a known device with piezoresistive detection and has already been described.
Figure 2:
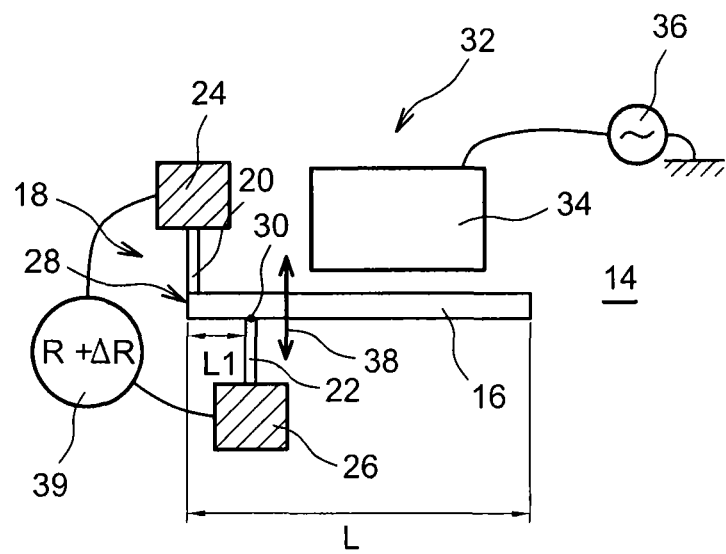
FIG. 2 is a diagrammatic top view of one particular embodiment of the device according to the invention.

FIG. 2 is a diagrammatic top view of a particular embodiment of the device according to the invention.

The device shown in this figure comprises:
a support or substrate 14, the surface of which is approximately plane,
a beam 16 with a constant cross-section suspended from the support 14 and capable of moving parallel to the plane of the surface of the support, and
means 18 of detecting displacement of the beam.

In the example shown in FIG. 2, these detection means 18 comprise two piezoresistive strain gauges 20 and 22. These two gauges are in the form of a beam and are therefore approximately straight. In addition, they are suspended from the substrate 14. Each strain gauge may be made from a piezoresistive material or it may comprise a stack comprising at least one piezoresistive material.

In accordance with the invention, the beam 16 is suspended from the support 16 through detection means 18 and is thus not directly anchored to the support 14.

The detection means comprise anchors 24 and 26 through which the piezoresistive gauges 20 and 22 respectively are fixed to the support 14.

As can be seen, the two gauges 20 and 22 are located on two opposite lateral faces of the beam 16 and are not in line with each other; therefore they are not aligned.

More precisely, the two gauges 20 and 22 are arranged perpendicular to the beam 16 (and parallel to the surface of the support 14); one end of the gauge 20 is at one end 28 of the beam 16, while its other end is fixed to the anchor 24; and one end of the gauge 22 is at a point 30 on the beam 16 at a distance from the end 28 of this beam, while the other end of the gauge 22 is fixed to the anchor 26.

In the example shown in FIG. 2, the beam 16 forms a resonator so that the device is resonant. In this case, this device also comprises means 32 of actuating the beam 16. In the example, these actuation means are of the electrostatic type and comprise an electrode 34 fixed to the support 14.

An alternating voltage source 36 is provided to bring the electrode 14 to an alternating voltage relative to the beam 16. When the beam 16 is thus excited, it vibrates parallel to the plane of the surface of the support 14, as symbolised by the double arrow 38 in FIG. 2.

Other means different from the electrostatic means can be used to excite resonance of the beam 16, for example piezoelectric, thermal or electromagnetic means.

The difference in design between the device according to the invention, for example the device shown in FIG. 2, and the device described in document [1], does not change in any way the method of reading the device; with this invention, the variation in resistance of the piezoresistive gauges is always read.

With this invention, although the mechanical structure has been modified, the reading can however be made by connecting read means 39 to anchors 24 and 26 of gauges 20 and 22. Therefore, these anchors 24 and 26 also form electrically conducting connections. The same is true in all examples given below, for the two anchors between which the read means are connected.

Therefore, the variation in resistance of gauges is read conventionally between the two anchors used as electrical connections. This reading may be made:
directly,
or using a lock-in amplifier,
or using a Wheatstone bridge (see document [1]),
or using a more sophisticated technique as explained in document [2] which should be referred to.

Variations in resistance of the gauges must have the same sign so that they do not cancel each other. This is why the gauges 20 and 22 are placed on opposite sides of the beam 16 in the case in FIG. 2.

In the special case in this FIG. 2, if the gauges 20 and 22 were on the same side of the beam 16, considering their respective positions along the beam, one would be in tension and the other would be in compression during a movement of the beam 16, and their corresponding resistance variations would be opposite.

Furthermore, the size of the gauges must be chosen to give the best possible compromise between Johnson noise generated by each gauge—this noise is proportional to the resistance of the gauge—and the stress applied to the gauge, that is inversely proportional to the cross-section of the gauge.

Therefore, as a first approximation, very short gauges with the smallest possible cross-section will be chosen.

Their relative position is also chosen to maximise stresses applied to these gauges. Therefore, this position depends on the proper operating mode chosen.

For example in the case in FIG. 2, it can be estimated that the optimum position for the resonant mode called "mode 1" is such that the distance L1 between the end 28 of the beam 16 and the point 30 is of the order of 10% of the length L of the beam 16.

The principle of the invention according to which the beam is suspended from the support through detection means, is also applicable to a beam for which the boundary conditions are "free-free", in other words the case in which the two ends of the beam are free: they can move parallel to the plane of the surface of the support.

In this case, the piezoresistive gauges are at a distance from the two ends of the beam.

Figure 3:
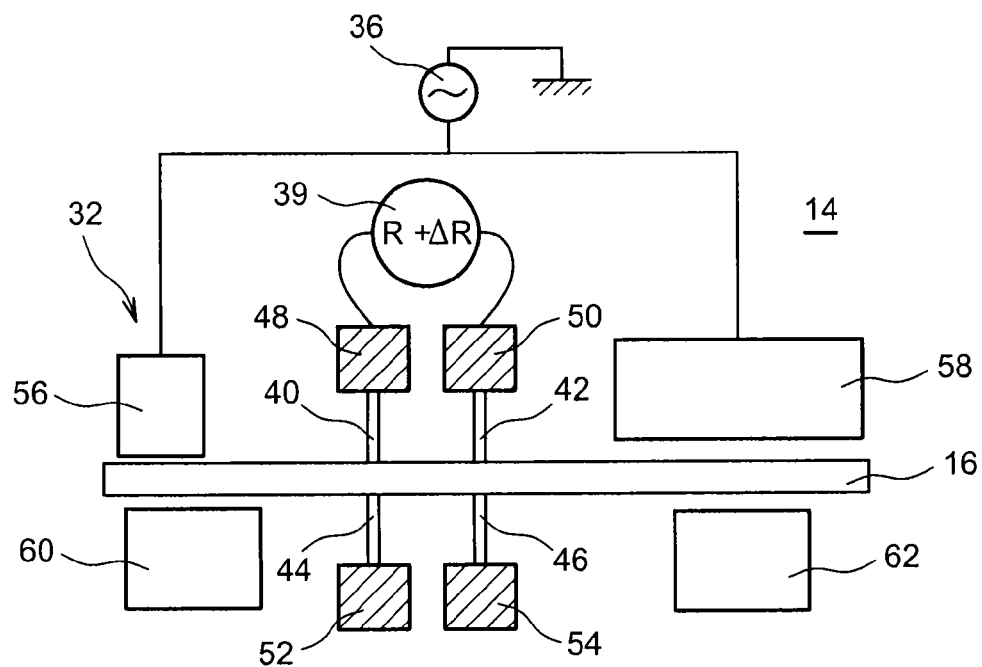
FIG. 3 is a diagrammatic top view of another particular embodiment using a beam with free ends.

FIG. 3 is a diagrammatic top view of an example of the invention in which the two ends of the beam 16 are free.

In this example, the device comprises four piezoresistive gauges 40, 42, 44 and 46. As can be seen, gauges 40 and 42 are located on one lateral face of the beam 16 and gauges 44 and 46 are located on the opposite lateral face. The anchors of gauges 40, 42, 44 and 46 are marked as references 48, 50, 52 and 54 respectively.

In the example in FIG. 3, the actuation means 32 of the beam 16 comprise four electrodes 56, 58, 60 and 62. As can be seen, the two electrodes 56 and 58 are on the same side of the beam 16 as gauges 40 and 42; and the two electrodes 60 and 62 are on the other side, like gauges 44 and 46.

Furthermore, in the example in FIG. 3, gauges 40 and 44 are approximately in line with each other and the same is true for gauges 42 and 46. Electrodes 56 and 60 are both facing one end of the beam 16, while the electrodes 58 and 62 are both facing the other end of the beam 16.

In the device shown in FIG. 3, the source 36 is designed to excite the two electrodes 56 and 58; and the read means 39 are connected between the anchors 48 and 50 (that then also form electrical connections).

Obviously, the source 36 could be connected differently, and it would even be possible to use several sources, and the connection of the read means depends on the connection of the sources.

For example, instead of being connected to electrodes 56 and 58, the source 36 could be connected firstly to the electrode 58 and secondly to the electrode 62 through a 180° phase shifter. Or two excitation sources could be used, one connected to the electrode 56 and the other to the electrode 60.

Similarly, instead of read means 39 being connected between anchors 48 and 50, they could be connected between anchors 52 and 54. Read means could even be connected between anchors 48 and 50, and other read means could be connected between anchors 52 and 54. This question will be discussed again later.

The configuration in which the two ends of the beam 16 are free has a large number of advantages as described below.

1. This configuration means that the variation in resistance of the gauges can always be read;

2. This configuration also makes it possible to get an effect of a lever arm if the gauges are relatively close to each other relative to the total length of the beam;

3. As in all other cases, one or several electrostatic actuation electrodes can be used; this means that priority can be given to some preferred resonant modes of the structure, or even two actuation harmonics at different frequencies can be decoupled.

4. It may be decided to read the variation of resistance between different gauge anchors (these anchors also being used as electrical connections), depending on the resonant mode used for the structure.

For example, for mode 1 (that is symmetric), a reading can be made of the resistance between anchors 48 and 50 and/or between anchors 52 and 54.

For an anti-symmetric mode, anchors 48 and 54 and/or anchors 50 and 52 will be used in preference.

A differential measurement can also be made by polarising anchor 50 with a voltage +V1 and anchor 54 with a voltage −V1, and for example measuring a current on the anchors 48 and 52 that are then connected together, for example using a "bonding" technique.

The gauges located on each side of the beam can also be axially offset in pairs. An example of this possibility is diagrammatically illustrated in FIG. 4.

Figure 4:
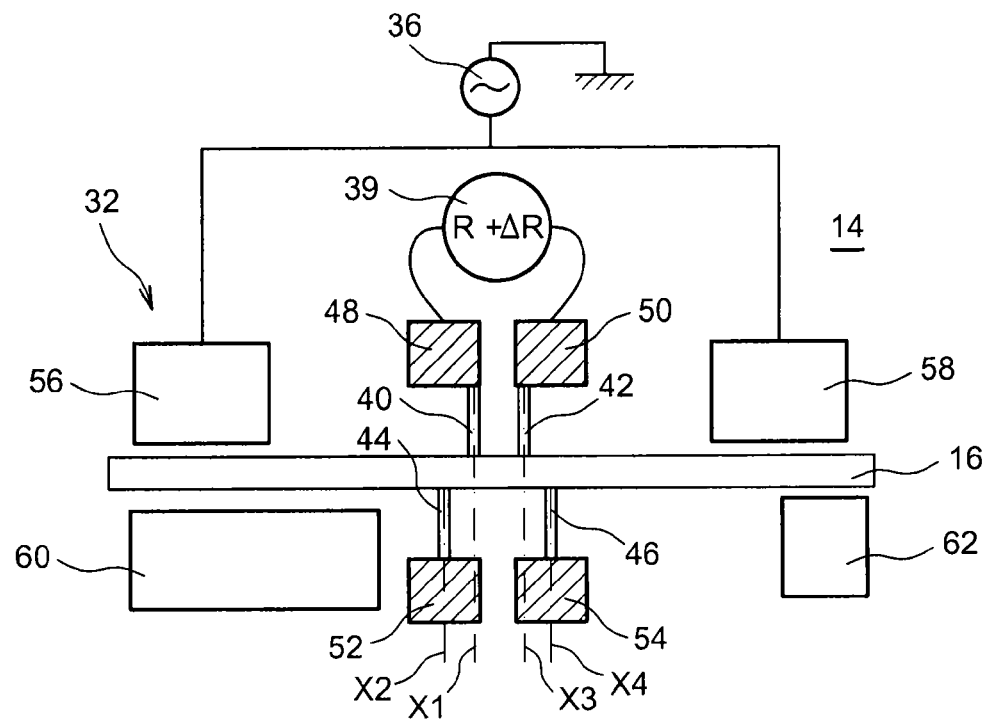
FIG. 4 is a diagrammatic top view of a variant of the device in FIG. 3.

In the device shown in this FIG. 4, the gauges 40 and 44 are no longer in line with each other: their corresponding axes X1 and X2 are no longer coincident; similarly, the corresponding axes X3 and X4 of gauges 42 and 46 respectively are no longer coincident (unlike the case in FIG. 3). As can be seen, in the example in FIG. 4, the axes X1 and X3 are in the zone delimited by axes X2 and X4.

In the invention, it would also be possible to place the gauges at the end of the beam; and the gauges may then be or not be along the same axial line.

Furthermore, instead of having a constant cross-section, the beam may have a variable cross-section.

Then, in the case in which the gauges are placed at the ends of the beam and when this beam forms a resonator, another advantage of the device (that is then resonant) lies in the fact that the maximum vibration amplitude of the beam before reaching the non-linear regime, is greater than the maximum vibration of an embedded-embedded type resonator, in other words a beam for which the two ends are anchored to the support.

Figure 5:
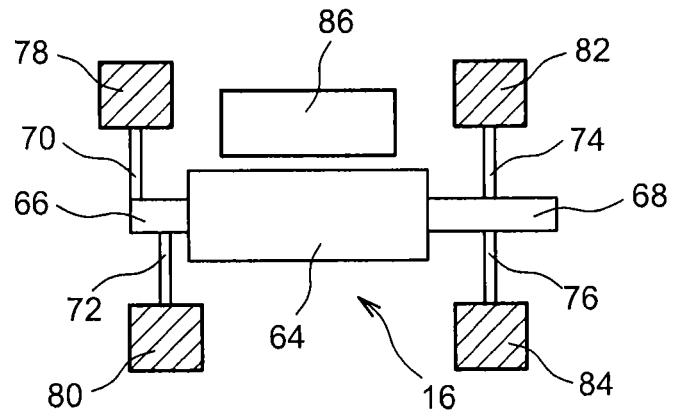
FIG. 5 is a diagrammatic top view of another example of the invention in which the beam has a variable cross-section.

FIG. 5 shows a diagrammatic and partial top view of an example of the invention in which the cross-section of the beam 16 is not constant. In this example, as can be seen, the beam 16 comprises a central part 64 and two end parts 66 and 68 on each side of the central part that are all in line with each other.

Furthermore, the device in FIG. 5 comprises two piezoresistive gauges 70 and 72 axially offset from each other and connected to the end part 66, and two piezoresistive gauges 74 and 76 with coincident axes and that are connected to the end part 68. The beam 16 is thus suspended through gauges 70, 72, 74 and 76. The references of the anchors of the gauges 70, 72, 74 and 76 are 78, 80, 82 and 84 respectively.

The device in FIG. 5 only comprises one electrode to actuate the beam 16. The excitation source and the read means are not shown.

In the invention, at least one of the piezoresistive gauges may be elastic. This means that the threshold at which the non-linear beam displacement regime begins can be moved away.

Figure 6:
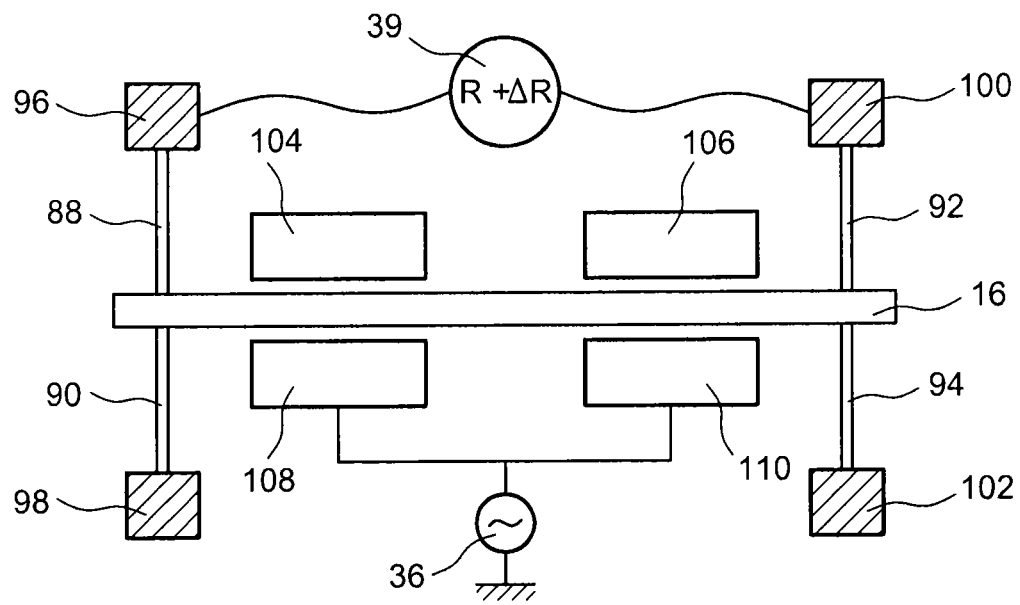
FIG. 6 is a diagrammatic top view of another example of the invention, using elastic piezoresistive gauges.

One example of this possibility is shown diagrammatically in FIG. 6. The figure shows the beam 16 with four piezoresistive gauges 88, 90, 92 and 94 with anchor references 96, 98, 100 and 102 respectively.

The axes of gauges 88 and 90 are coincident and are on opposite sides of one end of the beam. Similarly, gauges 92 and 94 have coincident axes and are on opposite sides of the other end of the beam 16, as can be seen.

In the example in FIG. 6, four electrodes are used to actuate the beam 16, namely two electrodes 104 and 106 that are on the same side as gauges 88 and 92, and two other electrodes 108 and 110 that are on the same side as gauges 90 and 94, as can be seen.

Two of the axially aligned gauges are elastic, for example gauges 88 and 90. As a variant, the four gauges 88, 90, 92 and 94 are elastic.

For example, the read means 39 of the device are connected between the anchors 96 and 100, and for example the source 36 excites electrodes 108 and 110.

Note that all that is necessary for a gauge to be elastic is that its length must be much greater than its width, for example at least 10 times as long as its width.

In the examples of the invention given above, the device was resonant. But the invention is not limited to this case; a device according to the invention may also be non-resonant.

Figure 7:
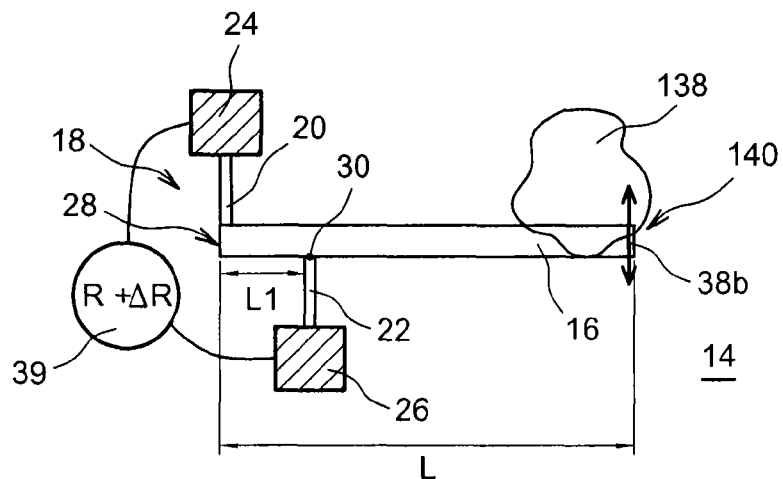
FIG. 7 is a diagrammatic top view of a non-resonant device according to the invention, FIGS. 8A to 8C diagrammatically show different steps in a method of making a device according to the invention, and FIGS. 9A to 9D diagrammatically show various steps in another method of making a device according to the invention.

One example of such a device is shown diagrammatically in FIG. 7. As can be seen, it is identical to the device shown in FIG. 2 except that it does not comprise any actuation means; in FIG. 7, the electrode 34 (and the source 32) in FIG. 2 do not exist. The same references are kept for elements in FIG. 2 that appear in FIG. 7.

The device in FIG. 7 can be used to measure static or quasi-static forces; for example, the force applied by a cell 138 partly supported on substrate 14 and partly on the free end 140 of the beam 16 can be measured. This cell provokes static or quasi-static displacement of the beam 16 in a transverse direction 38b.

The piezoresistive gauges used in the invention may be made of doped silicon. They may also be made of metal; to achieve this, the silicon can be very strongly doped until it is amorphous. Gauges made for example of a metal-silicon compound such as NiSi or PtSi can also be used.

It is also possible to obtain gauges from silicon elements on which a metallic layer is deposited, for example a gold or aluminium layer, to form the sensitive part of the gauges.

Furthermore the gauges in the invention may be identical (in other words have the same geometry and the same component materials with the same doping) or they may be different.

A device according to the invention may be made by surface technology.

Figure 8A:
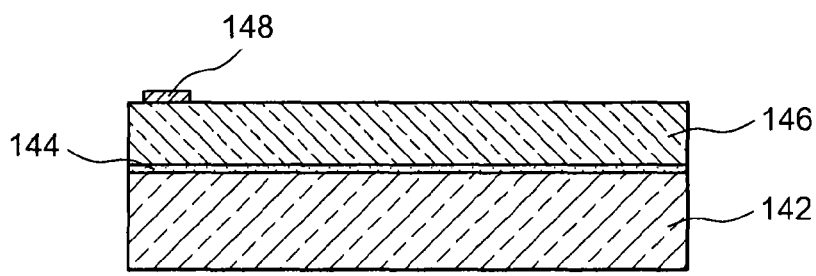
Figure 8B:
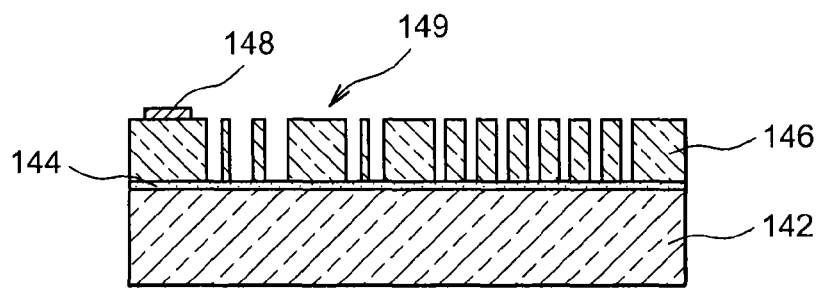
Figure 8C:
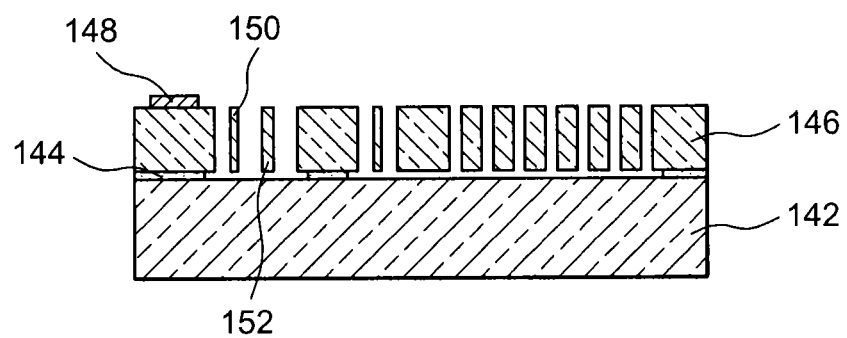

An example manufacturing method is diagrammatically and partially shown in FIGS. 8A to 8C.

The first step (FIG. 8A) is to deposit a Ti/Ni/Au layer on an SOI substrate comprising a silicon base substrate 142, an $SiO_2$ sacrificial layer 144 for example 0.4 μm thick, and a silicon layer 146 for example 4 μm thick. The contacts of the device such as contact 148 are delimited by photolithography and etching.

The next step (FIG. 8B) is to delimit the mechanical structure 149 of the device by photolithography and DRIE (Deep Reaction Ion Etching), stopping on the sacrificial layer 144.

The components of the device are then released (FIG. 8C) by exposure to hydrofluoric acid (in liquid or gas form), stopping after a determined time.

The result obtained is piezoresistive gauges such as the gauge 150, a resonator 152, and an excitation electrode (not shown) of the resonator.

In this method, photolithography may be done using an electron beam.

The resonator itself, but especially the piezoresistive gauges may be nanowires formed by top-down type surface technology according to another example of the manufacturing method that is diagrammatically shown in FIGS. 9A to 9D.

The first step is to form a sacrificial layer 154 (FIG. 9A) that may be made of $SiO_2$, SiGe or Si. An active layer 156 is then formed on the layer 154.

The layer 156 may be made of Si or SiGe. It is the layer in which the various elements or patterns of the device are formed, such as the beam and piezoresistive gauges.

A photosensitive resin mask 158 that is necessary to obtain the patterns, is then formed.

These patterns, such as patterns 160 (FIG. 9B) are then formed by photolithography and etching of the active layer. Resist trimming may be applied beforehand.

Figure 9A:
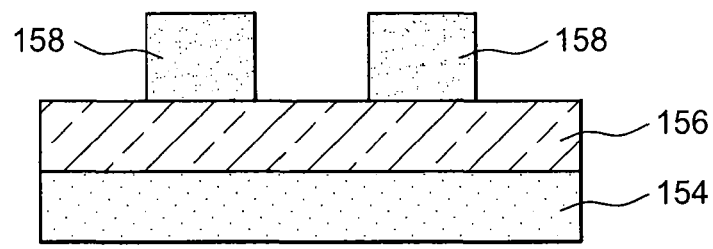
Figure 9B:
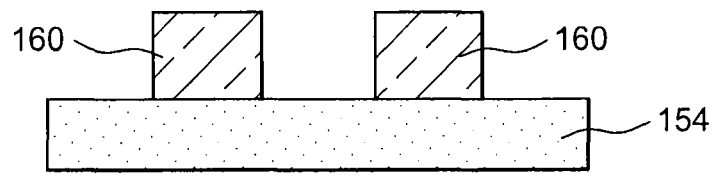
Figure 9C:
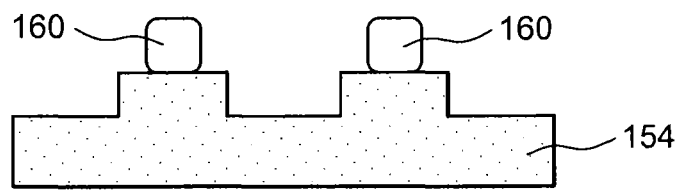
Figure 9D:
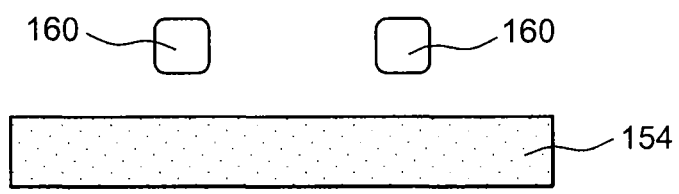

The next step is oxidation then de-oxidation to reduce the size of the patterns 160 and to round them (FIG. 9C).

The patterns 160 are then released (FIG. 9D) by exposure to hydrofluoric acid in the case of $SiO_2$ or a methane-oxygen type plasma in the case of SiGe.

The invention claimed is:

1. A device with a suspended beam and piezoresistive means of detecting displacement of the beam, the device comprising:
    a support comprising an approximately plane surface;
    a beam which is suspended from the support and capable of moving parallel to the plane of the surface of the support; and
    means of detecting displacement of the beam, comprising at least two approximately straight piezoresistive strain gauges suspended from the support, the two strain gauges not being in line with each other,
    in which the beam is suspended from the support through the detection means and is thus not anchored to the support directly, and
    in which said at least two strain gauges are located on two opposite lateral faces of the beam respectively.

2. The device according to claim 1, in which each strain gauge comprises a stack comprising at least one piezoresistive material.

3. The device according to claim 1, in which the beam forms a resonator and the device also comprises means of actuating the beam.

4. The device according to claim 3, in which the beam actuation means are electrostatic.

5. The device according to claim 1, in which the beam has a constant cross-section.

6. The device according to claim 1, in which the beam has a variable cross-section.

7. The device according to claim 1, in which the two ends of the beam are capable of moving parallel to the plane of the surface of the support, and the strain gauges are at a distance from the two ends of the beam.

8. The device according to claim 1, comprising two groups each containing at least two strain gauges, these two groups being located on two opposite lateral faces of the beam respectively.

9. The device according to claim 1, in which at least one of the strain gauges is elastic.

10. A method of manufacturing the device according to claim 1, comprising:
    forming the beam and the strain gauges using surface technology.

* * * * *